United States Patent
Kim et al.

(10) Patent No.: US 11,666,006 B2
(45) Date of Patent: Jun. 6, 2023

(54) RADIANT ARTIFICIAL LUNAR LIGHTS HAVING EFFECTIVE ELEMENTS FOR GROWING PLANTS

(71) Applicant: Jeom Doo Kim, Seoul (KR)

(72) Inventors: Jeom Doo Kim, Seoul (KR); Tae In Kim, Johns Creek, GA (US); Elijah Sangeun Im, Johns Creek, GA (US); Eden Soeun Im, Johns Creek, GA (US)

(73) Assignee: Jeom Doo Kim, Seoul (KR)

( * ) Notice: Subject to any disclaimer, the term of this patent is extended or adjusted under 35 U.S.C. 154(b) by 213 days.

(21) Appl. No.: 17/161,522

(22) Filed: Jan. 28, 2021

(65) Prior Publication Data

US 2022/0232781 A1    Jul. 28, 2022

(51) Int. Cl.
*A01G 7/04*    (2006.01)

(52) U.S. Cl.
CPC .................. *A01G 7/045* (2013.01)

(58) Field of Classification Search
CPC .............. A01G 7/045; H01L 33/025
USPC ...................................... 362/805
See application file for complete search history.

(56) References Cited

FOREIGN PATENT DOCUMENTS

KR           950014260 B1  * 11/1995
KR    10-2011-0100567      *  9/2011

* cited by examiner

*Primary Examiner* — Karabi Guharay
(74) *Attorney, Agent, or Firm* — Heedong Chae; Lucem, PC

(57) ABSTRACT

The present invention relates to the radiant artificial lunar light system that contains effective elements for the growth of plants. To explain more specifically, the radiant artificial lunar light system emits lights containing the main mineral materials distributed on the oceanic region of the moon, such as Si, Ti, Fe, Mg, Ca, Na, K, P, Mn, Cr, etc. each doped with a doner by the plural PN bond-type semiconductors' photon device modules; and plural PN bond-type semiconductors' photon device modules; and plural PN bond-type semiconductors' LED modules emitting lights of certain intensity, in order to form the radiant artificial lunar light system. If this system is turned into operation, using the microcomputer equipped with a means to control, controlling the wavelengths and luminous intensity, the radiant artificial lunar lights similar in nature (spectra) to the lights emitted from the oceanic and highland regions of the moon are made available so that the artificial lunar lights can supply the plants with the mineral elements for the plants to grow more effectively.

8 Claims, 14 Drawing Sheets

—A Cross section of the Lunar Soil—

(The Lunar Light Spectrums)

Process of synthesis and decomposition of IAA

RADIANT ARTIFICIAL LUNAR LIGHTS HAVING EFFECTIVE ELEMENTS FOR GROWING PLANTS

TECHNICAL FIELDS

The present invention relates to radiant artificial lunar lights containing effective elements for growing plants; more specifically, to a plurality of radiant PN bond-type semiconductor photonic device (LED) modules each doped with a doner having such mineral elements as Si, Ti, Al, Fe, Mg, Ca, Na, K, P, Mn, Cr, which are the main inorganic elements distributed in the oceanic region of the moon; and a plurality of PN bond-type semiconductor LED modules that give off lights of a certain degree, these two sets of elements contained therein.

The radiant lunar lights are controlled by a microcomputer for the appropriate level of lights, and when the system of the present invention is turned into operation, the artificial lunar lights, similar to the lights given off from the oceanic region and highland region of the moon are emitted. These artificial lunar lights help plants supplied with the aforesaid effective mineral elements for the plants to grow more effectively.

According to the present invention, the lights emitted by the artificial radiant lunar light system are free from heat, i.e. luminescent, therefore when they reach matters, the lights do not transform into heat, but into a mass of light source. Hence, the lunar lights can supply the mineral elements, and if the artificial lunar lights are applied to various fields, such as agriculture, medicine, pharmaceutical, microbiology, physics, including various other industrial fields, they are expected to bring forth a new era of advanced technology.

BACKGROUND OF THE INVENTION

Generally, when various crops are cultivated for industrial purposes in an enclosed area, such as in a room, rather than on the bare ground, fluorescence lamps, instead of white sunlight, are used. The kind of lamps vary according to the kinds of crops; for cucumbers, tomatoes and ginseng, super-red (730 nm wavelength (λ); for leaf crops, perilla, chrysanthemums, strawberries, red-light wavelength (λ) (660 nm); for apples, pears, peaches, yellow wavelength (λ)(570 nm) is used; in the case of anti-mold purpose of cucumbers and peppers, green light wavelength (530 nm) (λ) is used. In order to prevent the overgrowth of vegetables, blue light wavelength (λ) (450 nm), i.e. specially designated colored lights are used. At night, the lights are turned off for the plants to rest and sleep.

We see the farm crops growing near an airport, exposed to highly illuminating lights 24 hours each day, suffer from malnutrition because of the highly illuminating lights, their growth being hindered, for lack of rest, causing the inappropriate bearing of fruits. Therefore, plants also need rest and sleep at night.

Meanwhile, it was found that since the olden times the moon light has been influencing the growth of plants, Therefore, a trial was made on the blue lunar lights (430 nm) system, identical to those of the moon.

In a darkroom, a trial plant was placed and was exposed to the artificial lunar lights of the same cycle and time, and the growth of the plant was observed. The result was that the growth of the trial plant was definitely better than the contrastive trial plant which was not exposed to the artificial lunar lights. Through this trial it has been proven that the artificial lunar lights can promote the growth of plants better than the natural moon lights, thereby confirming part of the fact that the moon light in the night can influence in one way or another the earth's ecosystem. (Please refer to FIG. 3)

Based on these trial data, a patent application was filed titled "A method of promoting the growth of plants by artificial lunar lights." And patent registration was granted for the application. (Patent Registration No. 095484) FIG. 3 is one of the bunch of FIGS. 1A-16 carried in the Patent Bulletin of the patented inventions.

Apart from the aforesaid patented invention, there has been no literature found concerning the technology of promoting the growth of plants by artificial lunar lights at night.

CITED ART

Patented Art

Literature 1: Patent Bulletin No. 095484 (published 24 Nov. 1995)

Literature 2: Patent Bulletin No. 10-181085 (published 21 Dec. 2017)

CONTENTS OF THE INVENTION

Problems to be Solved

FIG. 1A is a photograph of the moon facing the earth provided by the U.S. NASA, and the dark area on the surface of the moon is the oceanic region (a) of the moon, and the white portion is the highland region (b) of the moon.

On Jul. 26, 1971, the Apolo 15 space ship landed on the oceanic region (a) of the moon, and the spacemen conducted a geological survey on the said oceanic region (a) of 5,700,000 square km. The spacemen brought valuable data to the earth, and through the analyses of these data, abundant geological and physical, etc. characteristics of the region are made available. Scientists still continue the researches.

FIG. 1B is a cross-sectional view of the internal construction of the moon; and FIG. 1C is a cross-sectional view showing part of the construction of the soil portion of the moon.

According to the U.S. NASA data, the Regolith layer of the oceanic region (a) is, depending upon its position, of a thickness of 1.0-1.5 cm-4.5-5.0 cm, and rock fragments of approximately 1-2 mm thick Olivine, Basalt, and approximately 1-2 mm thick mineral grains occupy the area, and white, yellow, green, red, brown, black glass particles are mixed therein.

Median soil layer is irregularly distributed, and approximately 0.5-20 mm-size glass particles and mineral grain approximately 30-60 μm with high contents of aluminum (Al) and calcium (Ca) and approximately 1-2 mm-size rock particles occupy 60-70% of the median soil layer, and the porosity is 41%-70%, and the thickness of the soil layer is approximately 3.3 m-16 m.

The main inorganic substance consisting of the oceanic region (a) of the moon is as in the following FIG. 1A.

TABLE 1

| Ingredients | $SiO_2$ | $TiO_2$ | $Al_2O_3$ | FeO | MgO | CaO |
|---|---|---|---|---|---|---|
| Soil Layer | 46.61 | 1.36 | 17.18 | 11.62 | 10.46 | 11.64 |
| Rock Layer | 44.20 | 2.26 | 8.48 | 22.50 | 11.20 | 9.45 |
| $Na_2O$ | $K_2O$ | $P_2O_5$ | MnO | $Cr_2O_3$ | | Total |
| 0.46 | 0.20 | 0.10.19 | 0.16 | 0.25 | | 100.13 |
| 0.24 | 0.03 | 0.06 | 0.27 | 0.70 | | 99.39 |

(Data provided by U.S. NASA)

The mineral materials' in the above table 1 consisting of the oceanic region (a) of the moon is as in the following table 1. They are extensively distributed in the soil of the earth, and they are effective mineral ingredients for the growth of plants. As well, as shown in the FIG. 2, the spectrum of lunar lights emitted from the lunar surface consisting of various mineral substances, different from the solar lights, appears to be of colors such as violet, ultramarine, blue, olive green, yellow, orange, red, centered on the wavelengths of 430 nm-750 nm scope. Calculated in terms of blue-centered energy, it turns out to be (E=hv) 2.7 eV-3.26 eV.

It has been known that the oceanic region (a) of the moon emits wavelength-centered photon energy, and the highland region (b) of the moon emits luminous intensity (lx)-centered photon energy.

In the process in which I, the inventor, continued studying the lunar lights, I observed the microscopic construction of the mineral particles concerned with the rock formation of the moon or the single-layer formation of the macroscopic multi-layer formation of its physical characteristics, and came to know that the rock formation of the oceanic region (a) is closely resembled to that of the generally used PN bond-type semiconductor LED (Light Emitting Diode).

FIG. 4 typifies the light-emitting device of the PN bond-type semiconductors' light-emitting device, and FIG. 5 is its comparative drawing showing the radiant artificial lunar light system.

FIG. 6 is a comparative drawing of the PN bond-type light-emitting device (A) of FIG. 4, and FIG. 5 typifies the lunar light system (B) consisting of the soil layers of the moon.

As is well known, the PN bond-type light-emitting semiconductor device (A) shown in FIG. 4 is an accumulative structure of the P-type semiconductor layer and the N-type semiconductor layer, and the surface of the said device is layered with transparent window layers.

Existing on the bond-layered surface of the P-type semiconductor layer is layered with a Depletion Layer (D) where there is no electron or positive hole.

The P-type semiconductor layer is a Doner of a Silicon (Si) having a valence of four and when doped with Ion doping, the Ion doped substance becomes a Covalent bond with the Silicon of valence four, and Gallium (Ga), Boron (B), Aluminum (Al), Indium (In) etc., whose valence are three, are Ion-doped and Covalent-bonded leading to the birth of a Positive Hole short of an electron.

Also, to the N-type semiconductor layer is Ion-doped with Silicon (Si) of valence four, doped with Gallium (Ga), phosphorous (P), stibium (sb), aluminum (Al), and arsenic (As), etc., whose valence are five, the Silicon (Si) of valence four and these other chemical substances of valence five are Covalent-bonded, one electron remaining.

Therefore, if the voltage is made to flow from the light-emitting device (A) of the PN bonding-type, i.e. the anode, the voltage flows from the P-type semiconductor layer to the N-type semiconductor layer, while the electric charge enters from N-type semiconductor layer into the Positive Hole of the P-type semiconductor layer via the Depletion Layer (D). At this time, if rated voltage is maintained continuously, the electron that moved from the low level of the N-type semiconductor layer to its high level moves into low energy level for the sake of stability, the other energies being emitted as photons.

Ray semiconductors differ depending upon their colors, red≑2 v, yellow≑2.4 v, green≑2.7 v, and blue≑3.2 v, the higher the wavelength, the higher voltage is necessary.

Thus we come to know that these light-emitting device of semiconductors and the construction of the light-emitting system of the lunar surface are almost identical macroscopically.

We can come to know that the light-emitting device (A) of the PN-bond-type semiconductor, shown in FIG. 4, can be compared with the light-emitting system (B) of the lunar surface to arrive at what is shown in FIG. 6.

In other words, in the light-emitting device (A) of the PN-bond-type semiconductor layer and the N-type semiconductor layer, the N-type semiconductor layer, depletion layer, P-type semiconductor layer, and window layer correspond, respectively, in the opposite light-emitting system of the lunar lights with (Olivine/basalt) layers, Depletion Layer, P-type semiconductor layer, central soil layer, and surface soil layer.

Therefore, the mechanism of the light-emitting operation of the PN-bond-type semiconductor device (A) due to voltage and the lunar light emitting system (B) of the lunar surface giving off Luminescence lunar lights due to the solar light energy are very similar.

Moreover, the physical characteristics of the light-emitting device of the PN-bond-type semiconductor and those of the light-emitting system of the oceanic region of the moon are similar, and stable as well.

TABLE 2

| Item/Light emitting Source | PN Semiconductor Light-emitting Device | Oceanic Region of the Moon |
| --- | --- | --- |
| 1. Light-Emitting Principle | Luminescence | Luminescence |
| 2. Operated Energy | Electricity | r-ray(10 KeV Solar Radiant Ray) |
| 3. Basic Material | $SiO_2$ | $SiO_2$ |
| 4. Infrared Rays/Ultraviolet Rays | None | None |
| 5. Thermostability | Weak(Light-emitting reduced by 20% at 125 Degrees Centigrade) | Weak(Light-emitting maintained at an average of 123 degrees Centigrade) |
| 6. Condensability | Excellent(External quantum efficiency increased by 35% via Window Layer) | Excellent(Condensability increased through the lunar surface layer) |
| 7. Durability of Tremor/Shock | Excellent(Good Adaptation to Harsh Environment) | Excellent |
| 8. Directivity Task -Lighting | Excellent(Target Illumination is possible when a certain area is set aside) | Excellent(Certain area, i.e. the earth is designated, therefore, target illuminationis possible) |

TABLE 2-continued

| Item/Light emitting Source | PN Semiconductor Light-emitting Device | Oceanic Region of the Moon |
|---|---|---|
| 9. Lamp Lumen Maintenance Factor | Excellent(LLM. Any light-emitting source decreases its strength with the passage of time, and the degree is shown) | Excellent |
| 10. Dispersion Light | None | None(The degree of light on the lunar surface is maintained at less than 0.3 cd, No dazzling light. At above 0.5 cd light dispersion and light dazzling occur) |
| 11. Light Traveling Straight | Excellent | Excellent |
| 12. Light Reaching Rate | Excellent(high visibility) | Excellent(high visibility) |
| 13. Color Efficiency (Light-emitting colors vary depending upon the materials used) | High | High |
| 14. Life Expectancy | Longlife | Almost Eternal |
| 15. Electricity Consumed | Lowelectricity Consumed | Lowelectricity Consumed |
| 16. Responding Speed | Speedy | Speedy |
| 17. Designated Spectrum Incarnation Capacity | Excellent(incandescent lamp and fluorescence lamp having continuous (glow lamps and fluorescence lamps having continuous spectra are difficult) | Excellent |

As aforesaid, the mineral materials forming the oceanic region and the highland region of the moon are turned into Photon minerals, i.e. photons called Phomi, and accommodated and accumulated in the plants in their light-consuming system, thereby the growth of the plants being assisted.

Therefore, in the lunar lights emitted from the oceanic region of the moon contain mineral elements such as Si, Ti, Al, Fe, Mg, Ca, Na, K, P, Mn, Cr, and O, and these minerals are supplied as essential physiological ecosystem of the earth to all the living things of the earth, namely, the grasses, vegetables with leaves, fruit-bearing trees, medicinal plants, horticulture plants, crops, oceanic plants, planktons, micro-brown algae, humanity, animals, and microbes.

As noted above, the moon plays an important role for the earth, nourishing it with its gravitation, growth of its plants at nighttime, moon light emitting of 430 nm-670 nm wavelengths, as well as with its important role of the mineral ingredients of its rock formation supplied to the earth's ecological system.

Although a research paper as to the mineral elements being carried is hard to find, some physical examples are available showing the possibility of the mineral elements being carried to the earth.

1. Atomic Spectrum

The P-type semiconductor's light-emitting elements of the PN-bond-type semiconductor, and according to the N-type semiconductor doped with a doner, the colors (wavelengths) of lights are each characteristically different.

FIG. 7 shows an example of the atomic spectra that show the scope of wavelengths ($\lambda$) 400 nm-700 nm spectra and the visible linear-emitting spectrum of Na, H, and Hg atoms.

In the above spectra, the gaseous elements in high energy state appear to be discontinuous spectra consisting of certain wavelengths. Each of the elements has certain spectrum for its own identification. In the case of Na, two strong spectrum belts appear in the yellow scope of 589.0 nm and 589.6 nm. The reason why a photon forming an atomic spectrum has only a discontinuous wavelength is that it has only a certain discontinuous energy. In this case the structural formula is $E=hc/\lambda$. (E=Energy, h=flank constant, speed of light in the vacuum, $\lambda$=wavelength). The photon such as this is formed when an electron in the atom moves from one energy level to another level.

The characteristic features of the linear line-emitting spectra of the Na, H, and Hg atoms are that these spectra do not display the phenomena of the light-emitting elements in the atoms but they are the phenomena of the specific photons (electrons) which, after leaving the light source and moving a certain distance in the space, reach the light splitting stage. This shows the fact that the quantity of matter is carried in the space in the form of photon energy by the photon energy. If a specific photon of the above Na atom fails to reach the position of the light-splitting stage, the specific nature (linear spectrum) of spectrum of the Na atom cannot appear at the light-splitting stage.

2. Equivalence of Energy and Quantity of Matter

One of the important aspect of Einstein's Specific Theory of Relativity is that the quantity of matter of energy is mutually convertible and essentially equivalent. When the quantity of matter m is converted into Energy E is as in the following form $E=mC^2$ (the relations between the two factors).

As C is the speed of light, enormous volume of energy can be generated from a very tiny amount of quantity of matter. Meanwhile, when the formula is solved in a reverse way, the energy E can be converted into quantity of matter m by the light (C). At this time, the quantity of matter that has been converted can become an energy source material.

The lunar lights, the second lights emitted from the rocks of the moon by the solar energy are luminescent free of heat, and the portion at which the lunar lights reach the earth is without heat. Therefore, the photon energy of the lunar lights is not converted into heat but into quantity of matter.

For the same reason, since the light emitted from the PN-bond body's light-emitting element is a kind of heatless luminescence, the photon energy emitted from the said light-emitting element reaches an object, it is not converted into heat but into light-source material.

For this reason, the present invention sets forth the following task.

Using the light-emitting device of the PN bond-type semiconductor, the present invention aims at inventing radiant artificial lunar lights having effective elements for growing plants.

Means to Solve the Task

The objective of the present invention is to provide a radiant artificial lunar light system containing effective ingredients for the growth of plants that give off artificial lunar lights similar to those emitted from the moon emitting the luminescent lights of combined plural PN bond-type semiconductor modules doped with donors supplied to the growing plants, that is, containing valid elements for the growth of plants.

Another objective of the present invention is to provide PN bond-type semiconductor light-emitting modules of specific wavelengths carrying valid ingredients for the growth of plants, and by combining plural given level, i.e. of luminous intensity, of light-emitting PN bond-type LED light-emitting devices, we can provide artificial lunar lights emitting the lights similar to those emitted from the oceanic and highland regions of the moon containing valid elements for the growing plants.

A detailed explanation of the present invention is as follows.

The present invention consists of the light-emitting device of the PN bond-type semiconductor modules that contain main light-emitting materials distributed in the oceanic region of the moon, such as Si, Ti, Al, Fe, Mg, Ca, Na, K, P, Mn, Cr, etc. elements, each doped with a doner; and the light-emitting device giving off a certain level of luminescence of a plurality of PN bond-type semiconductors' light-emitting device, thereby arriving at a radiant artificial lunar light system that emits artificial lunar lights similar to those emitted from the oceanic region and the highland region of the moon.

The above-noted radiant artificial lunar light system contains a microcomputer control means for the selective control of the light-emitting device; and a display showing the operation of the light-emitting device.

Each element of the above-noted Si, Ti, Al, Fe, Mg, Ca, Na, K, P, Mn, and Cr is the effective mineral elements supplied to the plants as valid ingredients for the growth of plants via the artificial lunar lights, but the valid ingredients are not limited to these aforesaid mineral elements. but the various other chemical compounds of the elements shown in table 1 can be included as well.

Also, in the case of the LED light-emitting device and the PN bond-type semiconductor light-emitting device in general, Si semiconductor's various inorganic elements, i.e. P-type or N-type semiconductor's basic materials, are Iondoped. is intended for the purpose of light-emitting wavelength of colored-light emitting. However, this is not for the purpose of providing valid ingredients for the growth of plants, as in the case of the present invention, or for the purpose of supplying mineral ingredients for a certain purpose.

The gist of the present invention is not for the production method of the PN bond-type semiconductors.

According to the present invention, by the combination of the plural PN bond-type semiconductors' light-emitting system modules giving off lights containing mineral elements, in which each of the various mineral elements is doped with a doner, and a plurality of PN bond-type semiconductor modules emitting lights of a certain level, the present invention can arrive at new artificial lunar lights of certain wavelengths that can supply the plants of the earth with valid and essential mineral elements to further promote the growth of plants.

In general, the plants that undergo assimilation in the daytime are considered to rest at night, without lights cast to the plants. However, the assimilated materials such as sugars produced by the plants' production cells in the daytime are made to flow into consumption cells by the photon energy in the daytime, using artificial lunar lights. In this way, green plants are allocated and coordinated to promote the growth of plants. (Reference is made to the Patent Bulletin No. 095484).

A more detailed explanation of the above-noted paragraph is as follows. As shown in FIG. 8, if the wavelengths ($\lambda$) of 430 nm-670 nm blueish lights are emitted from the oceanic region of the moon to the plants, the pigments such as riboflavin and violaxanthin consume blue wavelengths (430 nm) which are most effective for the photon-oxidation of Oxin (IAA) and then begins oxygenation of Oxin (IAA). Oxin (IAA) is destroyed by IAA-Oxidase and gives off $CO_2$.

When tracking the flow of photon energy, we find that the energy value of wavelength 430 nm is approximately 3.26 ev and that by partially using this energy as activated Oxin-oxidase energy, and by using the oxygenated energy—oxidated from Oxin (IAA)—as plants' cell-division energy for the plants to grow. In the solar energy, the oxygenation of Oxin (IAA) does not occur.

Therefore, without the lunar light energy supplied in the night from the oceanic region of the moon, it will be impossible for the earth's plants to grow, resulting in the situation where humanity as well as animals can hardly survive by the destruction of food chains in the ecological system.

The composition and disintegration of Oxin (IAA) take place in the same way in the lunar lights in the present invention, hence the growth of plants and crops can be further promoted in the darkness.

Basically, plants receive via their roots the valid organic, as well as inorganic, ingredients in the soil, and their leaves carry on their life by the photon energy via consumption of carbon in the air, and at night, the plants are supplied with the photon energy of the lunar lights as well as minerals via the artificial lunar lights to further promote the growth of plants. This has been confirmed through trial data.

At this time, it has not been academically confirmed whether the mineral elements supplied through the lights emitted from the radiant artificial lunar light system in the present invention are consumed as nutriments through their leaves or through the composition and disintegration of the plant leaves playing the role of a catalyzer of Oxin (IAA). Botanists are making their researches into this.

Anyway, it has been confirmed through trial data that the growth of plants is further promoted by the artificial lunar lights emitted to them.

Effects of the Invention

According to the radiant artificial lunar light system of the present invention, because the artificial luminescent lunar lights are similar to those emitted from the oceanic and highland regions of the moon, the artificial lunar lights can be provided for the agricultural fields economically at lower cost.

Furthermore, the enclosed area growing crops for industrial purposes can be benefited with the artificial lunar lights at dark nighttime emitted to them with the artificial lunar lights of certain wavelengths at the right time for the crops to grow effectively, providing them with the crops with appropriate valid materials for each of them, thereby further promoting the growth of plants of various kinds.

Also, because through the lights emitted, the targeted materials can be supplied to the selective plants or crops for application to the agricultural, medical, pharmaceutical, microbiological, physical chemistry, and various other fields to bring forth a new era of advanced science and technology.

DETAILED DESCRIPTION OF EMBODIMENTS OF THE INVENTION

Examples of the embodiments of the present invention are explained in detail by the above-referenced figures, as follows.

Embodiment 1

Figure 1A:
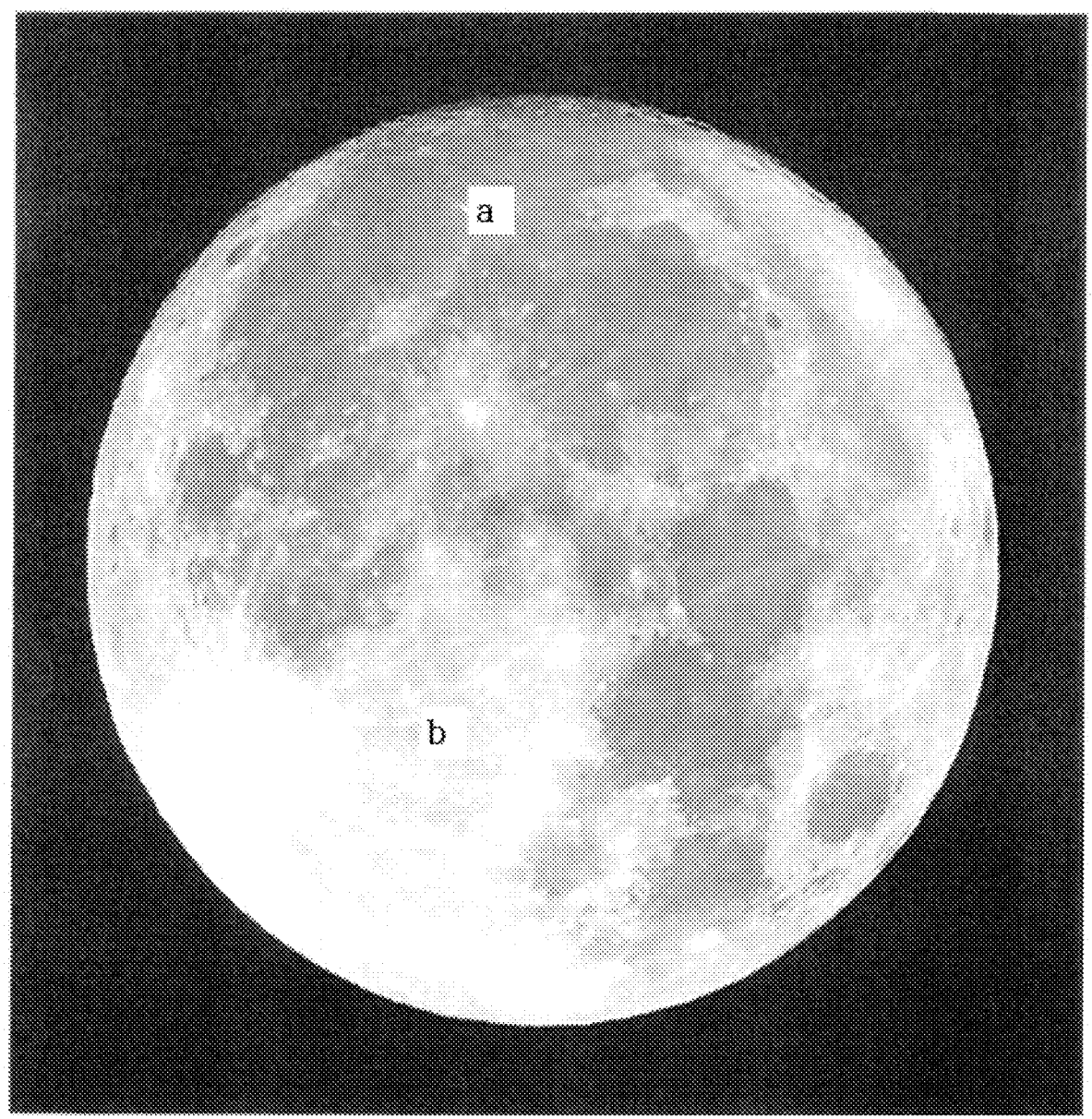
FIG. 1A shows the moon facing the earth.
Figure 1B:
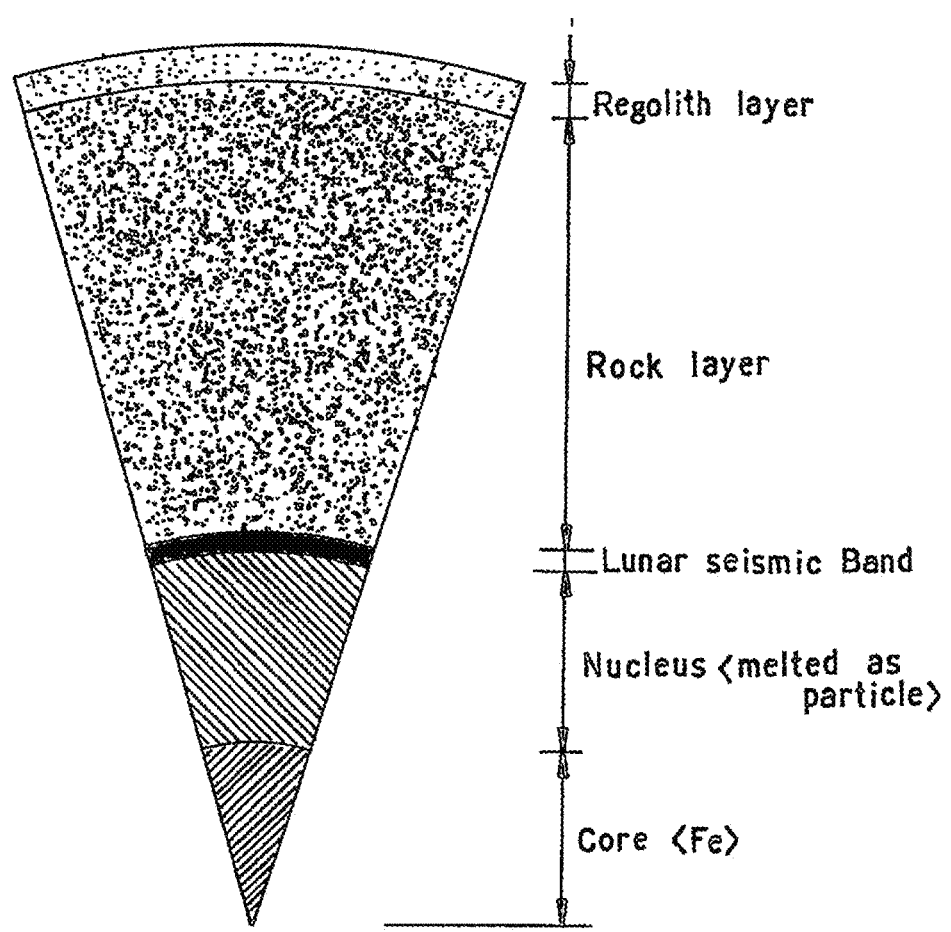
FIG. 1B is a sectional drawing showing the moon's soil-layers.
Figure 1C:
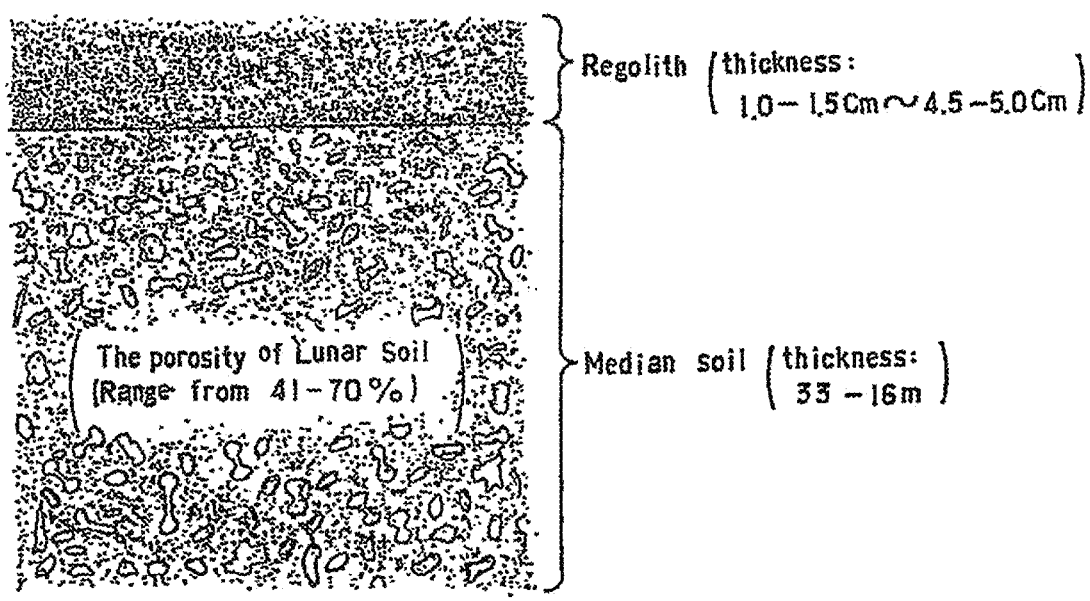
FIG. 1C is a sectional drawing showing part of the moon's soil-layers.
Figure 2:
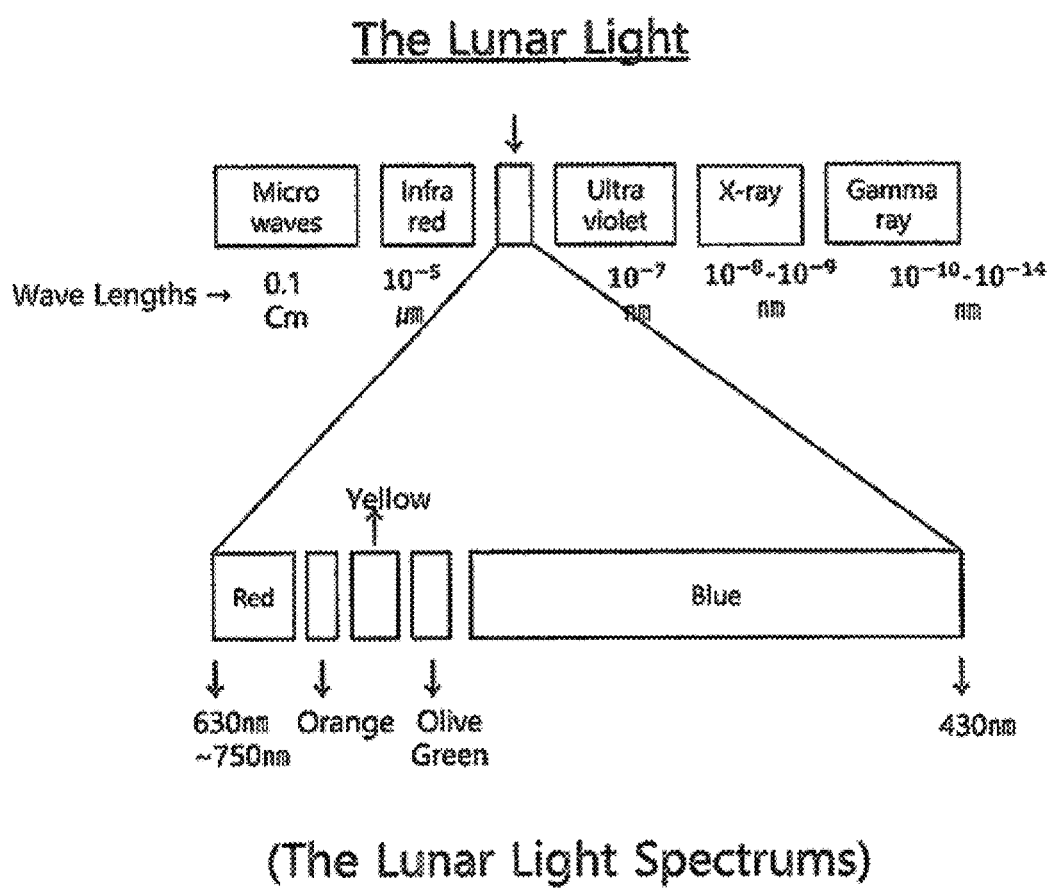
FIG. 2 is an illustrative drawing showing the spectra of the lunar lights.
Figure 3:
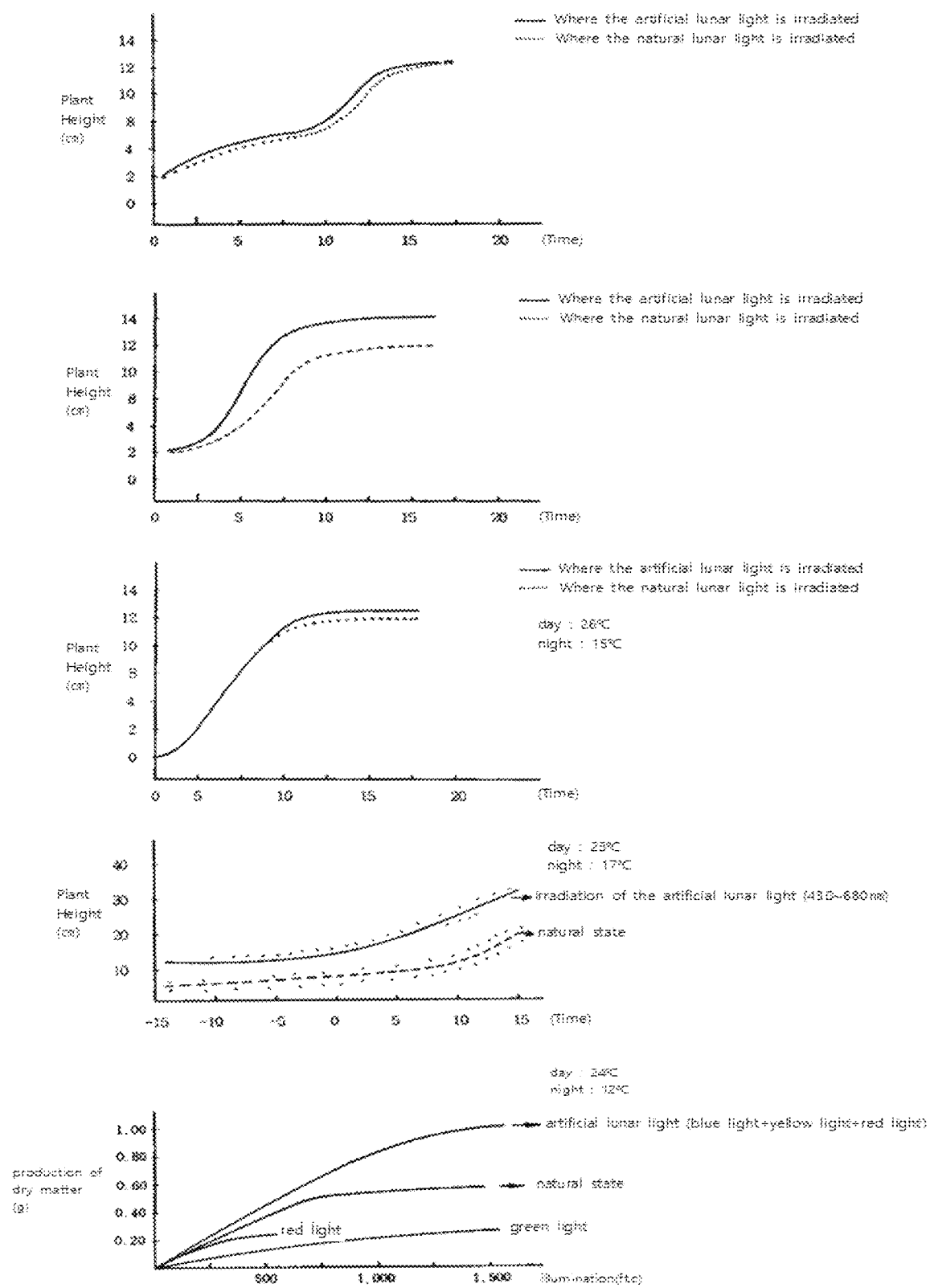
FIG. 3 is a bunch of trial data of the plant growth by the artificial lunar lights.
Figure 4:
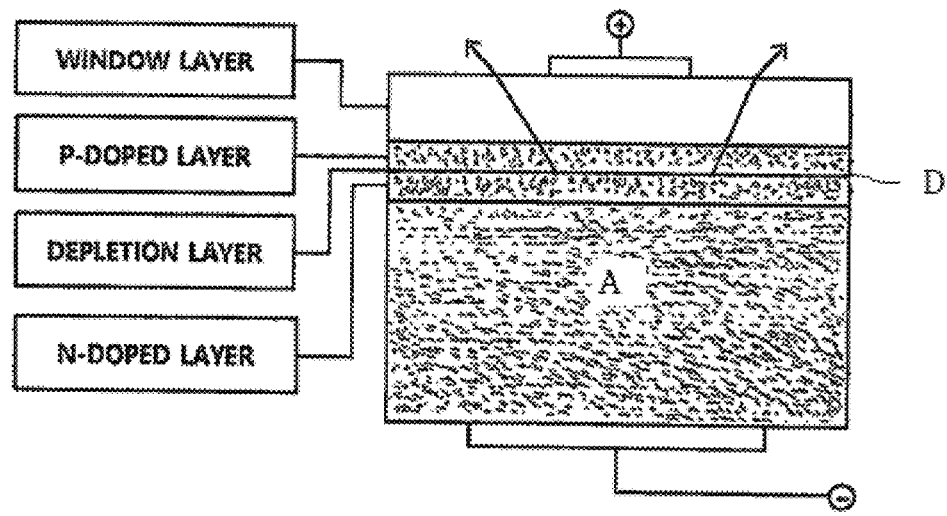
FIG. 4 shows the LED semiconductor's light emitting system.
Figure 5:
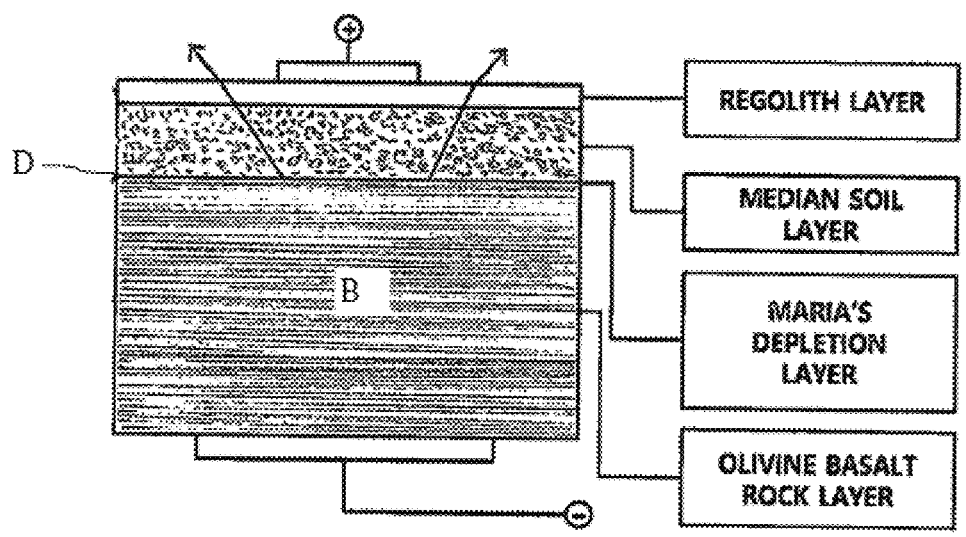
FIG. 5 is a typical drawing showing the lunar light-emitting system of the moon consisting of the lunar soil layer.
Figure 6:
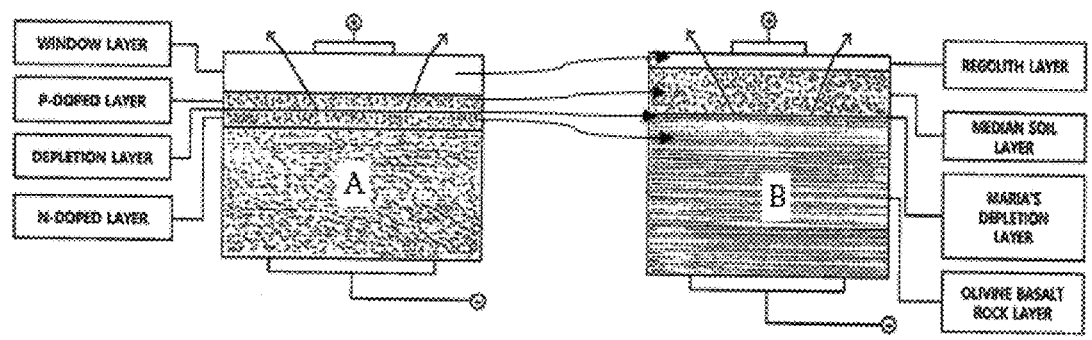
FIG. 6 compares the light-emitting system shown in FIG. 4 and the light-emitting system shown in FIG. 5.
Figure 7:
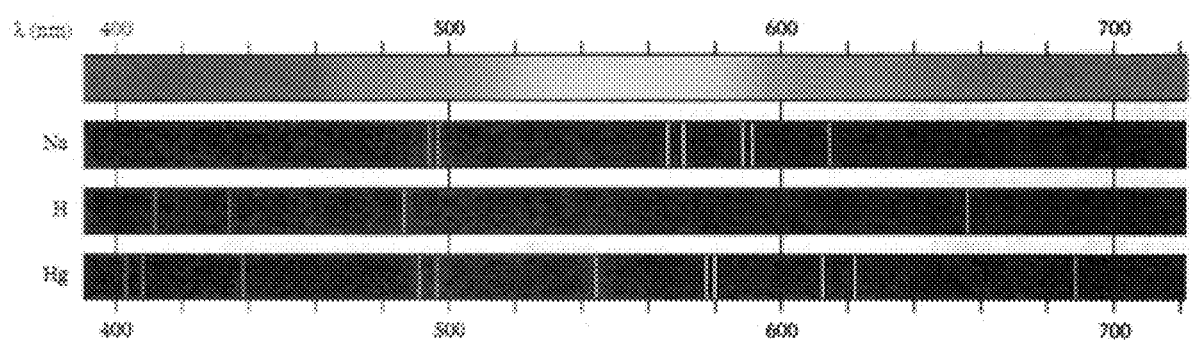
FIG. 7 exemplifies the light spectra.
Figure 8:
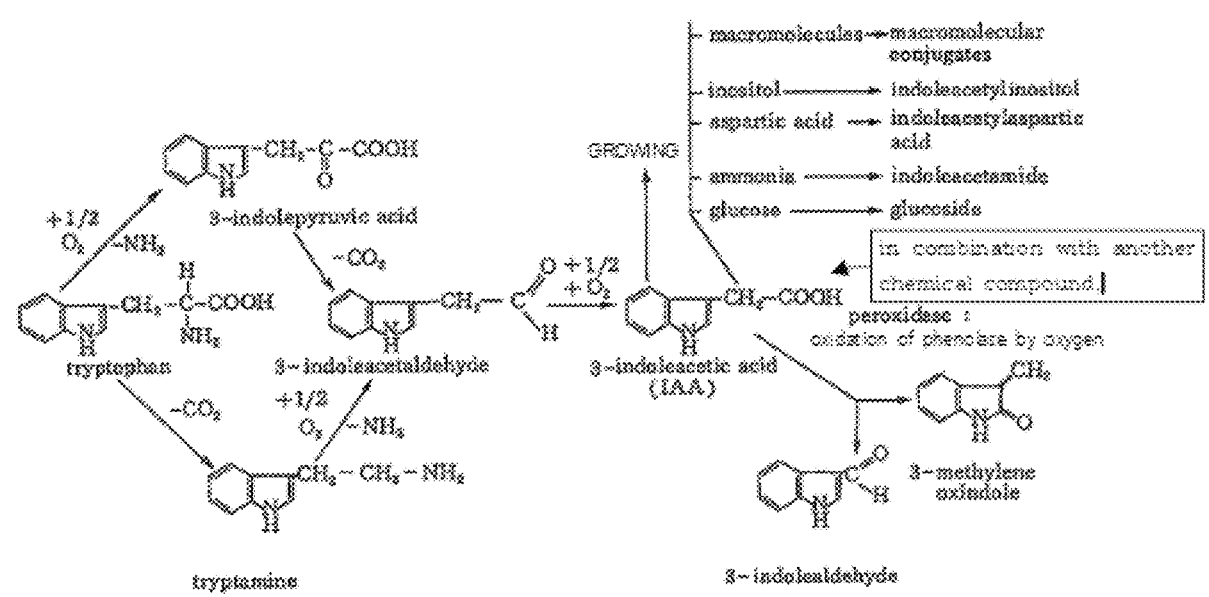
FIG. 8 shows a formula showing the response to the composition and disintegration of Oxin (IAA)
Figure 9:
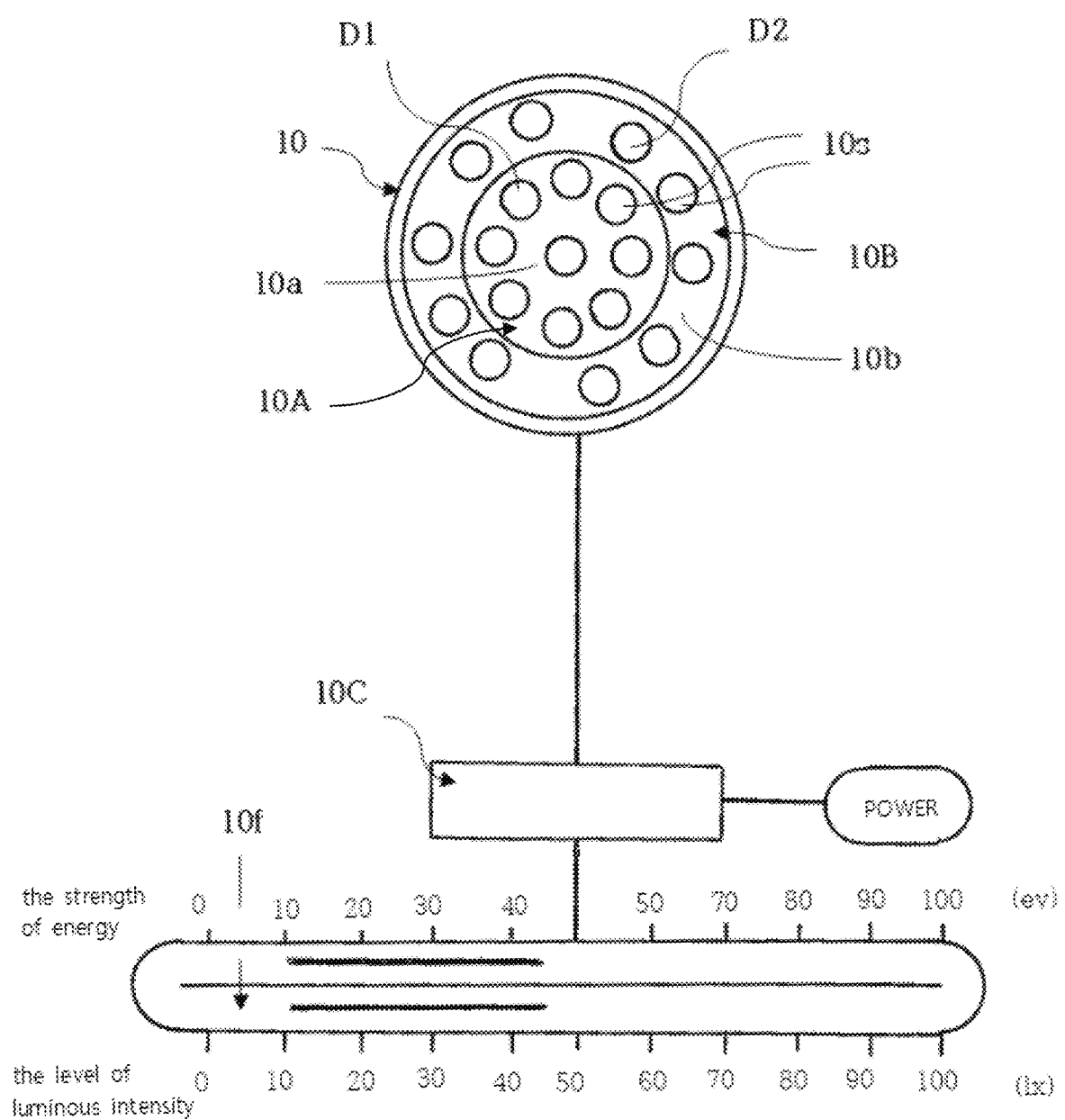
FIG. 9 shows the radiant artificial lunar light system shown in the Embodiment 1 of the present invention in which the lunar light-emitting system is shown.

FIG. 9 is an illustrative drawing showing the radiant artificial lunar light system in Embodiment 1 of the present invention.

The radiant artificial lunar light system (10) is shown to have the photon energy and the main function of brightness. The artificial light-emitting system (10) contains the photon energy core (10A), which contains the photon device modules (10a) of high energy-emitting plural PN bond-type semiconductor light-emitting device (D1) and luminous intensity core (10B), which contains photon device modules (10b) of the plural PN bond-type semiconductor light-emitting device (D2) emitting lights of certain luminous intensity. The intensity (eV) and brightness (lx) of the radiant artificial lunar light system are set according to the lunar calendar dates by the lunar lights emitted from the oceanic and highland regions of the moon. For this a microcomputer (10C) is provided with a program that automatically controls the said lunar lights. The microcomputer is equipped with a display panel (10f) showing the strength (ev) of the photon energy of the artificial lunar lights and their luminous intensity (lx). The radiant artificial lunar light system (10) also contains an LED sensor (10s) for operational observation.

When the radiant artificial lunar light system is supplied with electricity, i.e. powered, the photon energy core (10A) emits lights, that is high-density energy and wavelength of the artificial lunar lights, by the plural PN bond-type semiconductor light-emitting device (D1) and the strength of the photon energy is shown on the display panel (10f) provided in the microcomputer. The display panel (10f) of the channel (B) is provided with an energy strength scale of 0-100 eV.

And the luminous intensity core (10B) emits the brightness-centered artificial lunar lights of low brightness-intensity by photon device modules (10b) of the PN bond-type semiconductor light-emitting device (D2). This brightness-intensity of the artificial lunar lights is shown on the display panel (10f) of the microcomputer (10C). On the display panel 10(f) of the channel (B) is shown the brightness-intensity scale of 0-100 lx.

As noted above, the radiant artificial lunar light system (10) emits the high-intensity photon energy by the photon device modules (10a) of the PN bond-type semiconductor light-emitting device (D1); and by the photon device modules (10b) of the PN bond-type semiconductor light-emitting device (D2), the luminous intensity core (10B) emits the low energy-intensity and brightness-centered lights, and the program inputted in the microcomputer (10C) automatically controls the strength and brightness of the artificial lunar lights corresponding to the equivalent level of the moon lights emitted from the oceanic and highland regions of the moon, so that the artificial lunar lights similar in nature to the ingredients (spectra) of the moon lights can be made available.

Therefore, in case where various kinds of crops are grown in an enclosed area such as in a room, the radiant artificial lunar light stem (10) may be used to emit the artificial lunar lights to the crops at dark nights without sunlight to further promote their growth.

Embodiment 2

Figure 10:
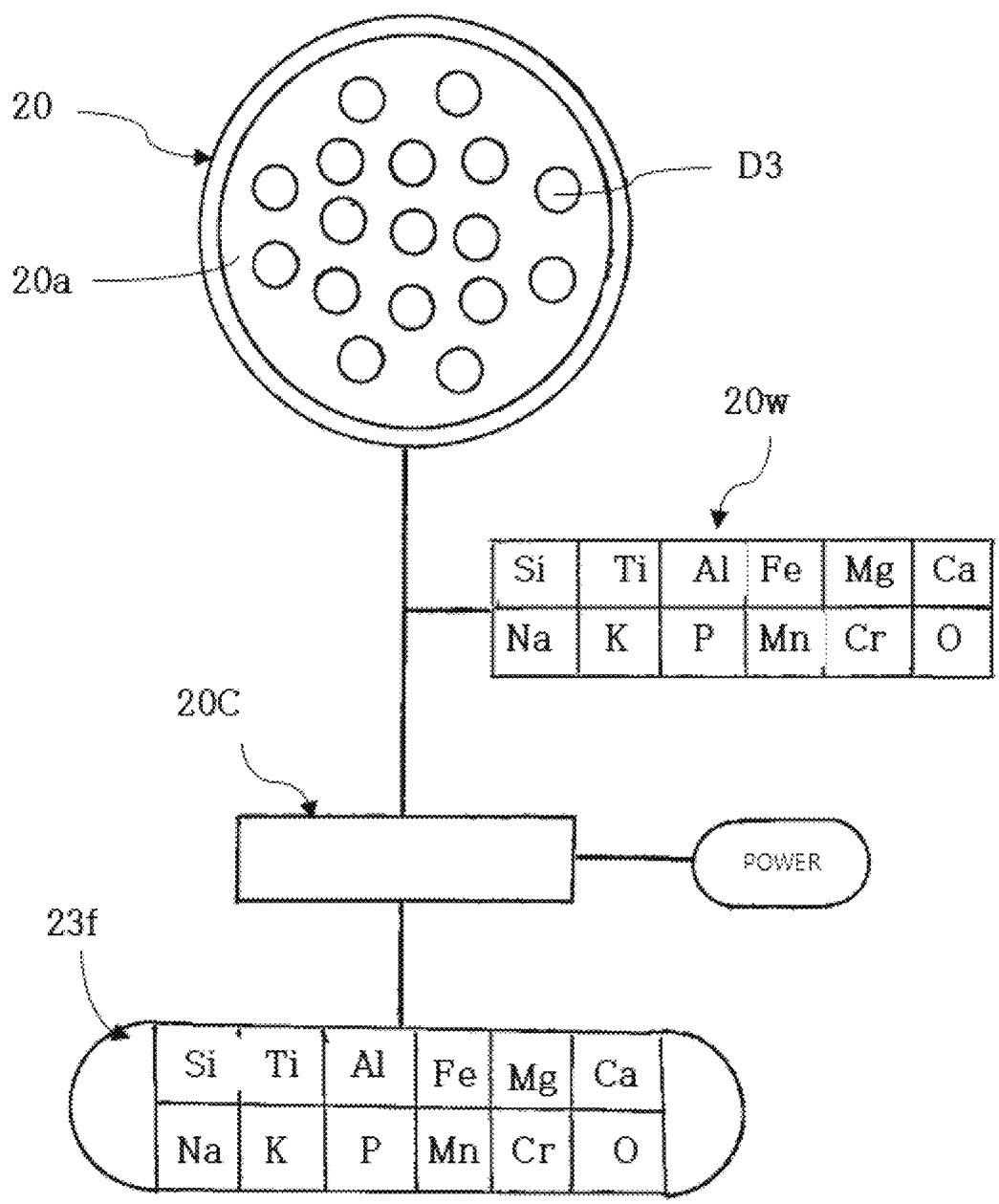
FIG. 10 shows the radiant artificial lunar light system shown in Embodiment 2 of the present invention in which the lunar light-emitting system is shown.

FIG. 10 illustrates the radiant artificial lunar light system shown in Embodiment 2. The radiant artificial lunar light system (20) is shown with the function of supplying valid mineral elements for the growth of plants. In other words, Si, Ti, Al, Fe, Mg, Ca, Na, K, P, Mn, Cr, etc., which are the important mineral materials in the oceanic region of the moon and which are also widely distributed on the earth. These mineral materials each consists of photon device module (20a) of the plural PN semiconductor light-emitting structure (D3) doped with a doner, and contains the microcomputer (20C) provided with a program to control the radiant artificial lunar light system (20).

The microcomputer (20C) is provided with a selective panel (20f) to designate via a keyboard or directly manually such mineral elements as Si, Ti, Al, Fe, Mg, Ca, Na, K, P, Mn, Cr, and according to the direction of the program inputted in the microcomputer (20C), the strength of the lunar lights is automatically controlled, as well as the input and output of data, and the automatic/manual Wi/Fi means can be operated, and is also equipped with an operation display window (20w).

If the artificial lunar light-emitting system is powered by electricity, the PN bond-type semiconductors' light-emitting device (D3) emits lights, resulting in the radiant artificial lunar light system emitting artificial lunar lights.

At this time, because the light-emitting device of the PN bond-type semiconductors' light-emitting device (D3), with each of such mineral elements as Si, Ti, Al, Fe, Mg, Ca, Na, K, P, Mn, Cr. etc. being doped with a doner, the artificial lunar lights emitted from the PN bond-type semiconductors contain the mineral elements and carried by the photon energy.

Hence, the artificial lunar lights similar in quality to the lights emitted from the oceanic region of the moon are emitted. If the artificial lunar lights are emitted to the plants, since the artificial lunar lights are heatless and luminescent, they are not converted into radiant heat, but into quantity of matter of the mineral elements such as Si, Ti, Al, Fe, Mg, Ca, Na, K, P, Mn, Cr, etc. carried by the photon energy, thereby consumed by the plants, for the plants as the chrysanthemum to grow more effectively. This has been proven by the trial data.

FIGS. 12-16 show the results of the trial data conducted with chrysanthemums, in a trial room of 25 degrees Centigrade, with daylight/nighttime of 16/8 hours, and cultivation period of 30 days. In this cultivation trial conducted with chrysanthemums, the artificial lunar lights emitted from the radiant artificial light system were emitted to the trial plants, and the comparative plants were emitted with fluorescent lamp lights. The results were that the plant height (cm) (FIG. 12), internode length (cm) (FIG. 13), the number of leaves (FIG. 14), number of roots (FIG. 15) were much better than the comparative plants. and their fresh weight (FIG. 16) was much better than the comparative plants. Thus the results of the trial plants were much better in terms of their growth efficiency.

Moreover, if the selective button panel (20f) selectively designates an optional element out of the Si, Ti, Al, Fe, Mg, Ca, Na, K, P, Mn, and Cr, list, the PN bond-type light-emitting device of the artificial light-emitting system (20) of the selected and doped PN bond-type semiconductor light-emitting device (D3) selectively operates, and the state of the operation is shown on the operational display window (20w).

For example, if the button panel (200 selects and designates the Mg button, the PN bond-type light-emitting device (D3) of the radiant artificial lunar light system (20) emits the PN bond-type semiconductors' light-emitting system, emitting the lights of the selected Mg element doped with a doner.

Therefore, in the artificial lunar lights of the radiant artificial lunar light system (20) emits lights of Mg element contained in the form of photon energy. The artificial lunar lights containing the Mg element are heatless and luminescent, and therefore, if the artificial lunar lights are brought in contact with objects, the objects are not converted into heat, but into quantity of matter of the light source material (Mg).

As well, if plural mineral elements are designated, PN bond-type semiconductors' light-emitting device containing plural mineral elements are emitted with the lights simultaneously, resulting in the plural mineral elements being supplied with lunar lights.

Without doubt, the PN bond-type semiconductors' light-emitting device (D3), in which each of the above-noted mineral elements is doped, can form the photon device modules (20a), assembled with the PN bond-type light-emitting devices (D3), and can selectively emit lights, and in the case of certain crops being cultivated, can form the photon device module of a single doped mineral element by the PN bond-type semiconductors' light-emitting device (D3), for the exclusive use for the crop that has been selected in order to apply the best possible light for its growth.

As noted above, because the radiant artificial lunar light system in Embodiment 2 can emit lunar lights selectively, the photon modules (20a) can be formed to contain lunar light-emitting devices (D3) applicable to each kind of crops selectively, and this is advantageous for application to the medical, pharmaceutical, microbiological, and various physics trials.

Embodiment 3

Figure 11:
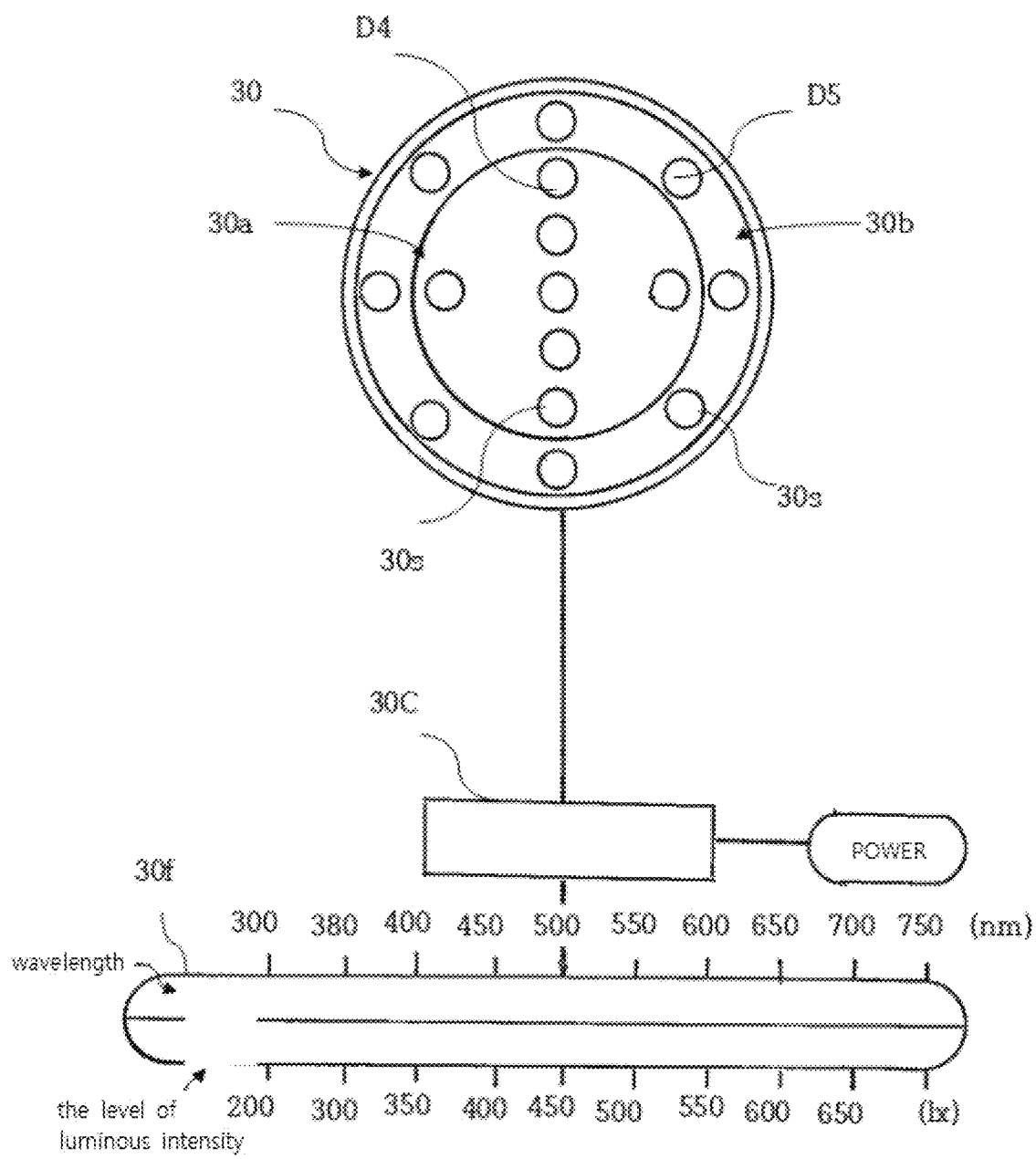
FIG. 11 illustrates the radiant artificial lunar light system shown in Embodiment 3 of the present invention.
Figure 12:
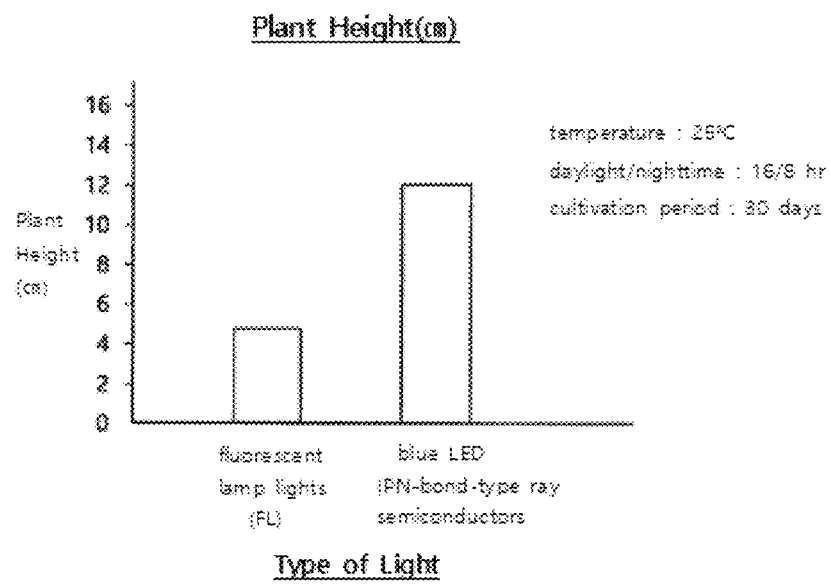
FIG. 12 compares the length of leaves grown by the artificial lunar lights of the present invention.
Figure 13:
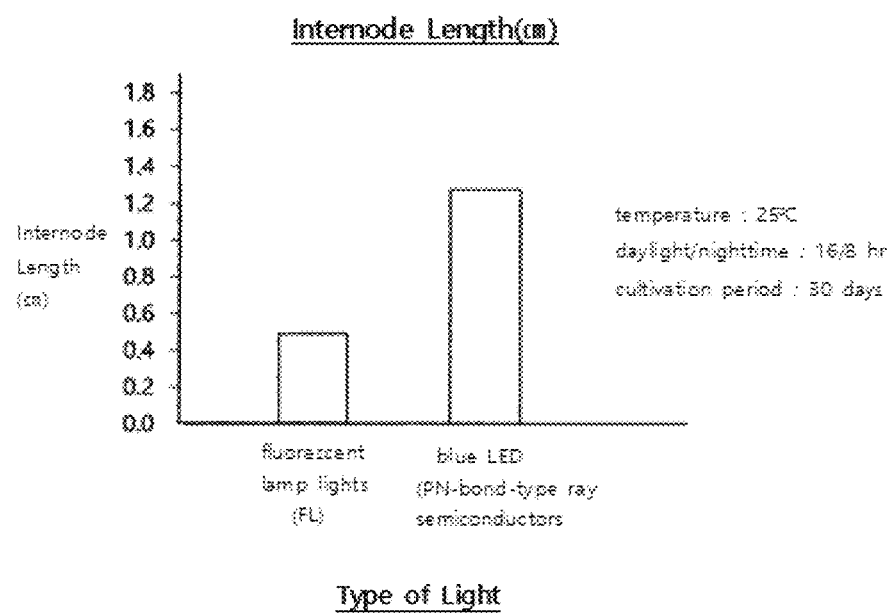
FIG. 13 compares joint-by-joint growth of plants by means of the artificial lunar lights of the present invention.
Figure 14:
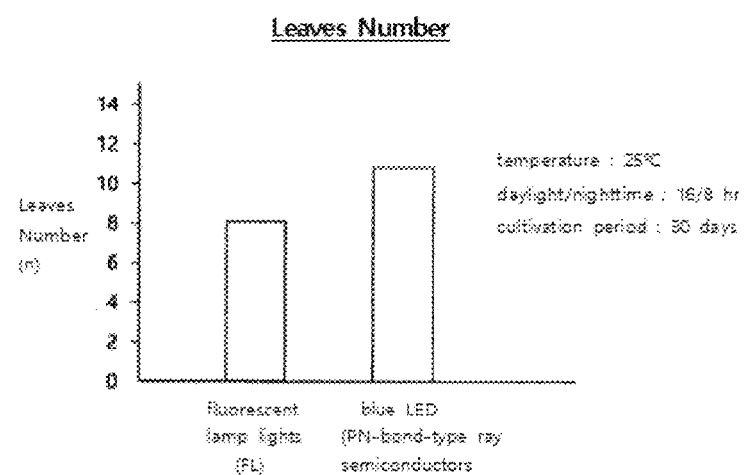
FIG. 14 compares the number of the plant leaves grown by means of the artificial lunar lights of the present invention.
Figure 15:
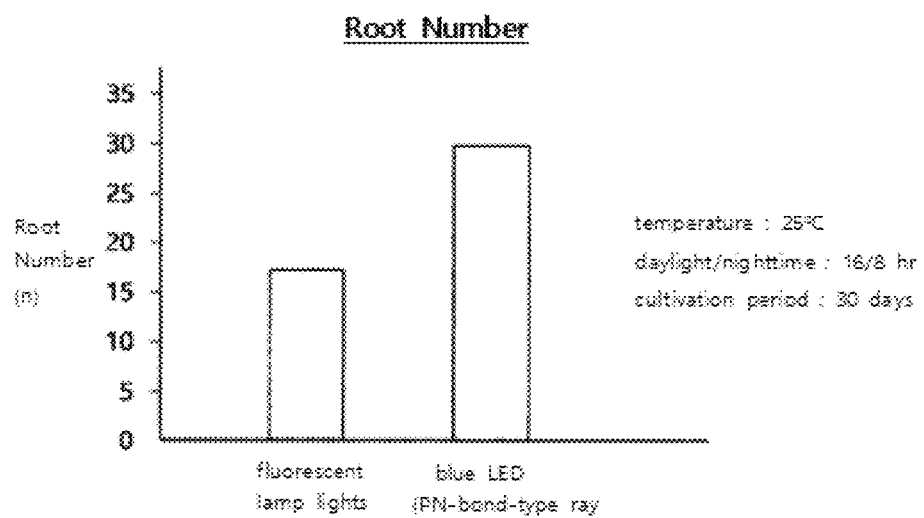
FIG. 15 compares the number of the plant roots grown by means of the artificial lunar lights of the present invention.
Figure 16:
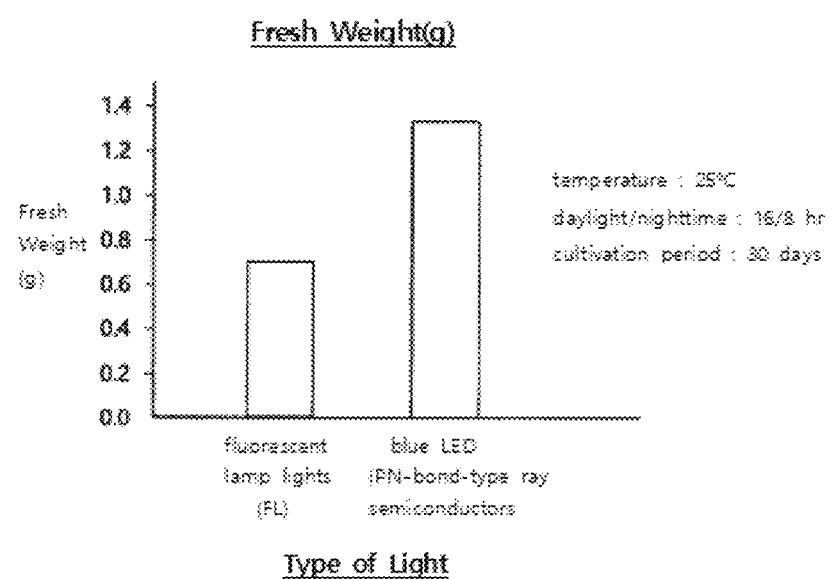
FIG. 16 compares the weight of the plants grown by means of the artificial lunar lights of the present invention.

FIG. 11 illustrates the radiant artificial lunar light system in Embodiment 3 of the present invention.

The artificial lunar light-source system (30) is shown where the light-source system (30) emits certain lights that contain photon modules (30a), i.e. a collection of PN bond-type semiconductors' light-emitting devices (D4) designed in similar nature to the lunar lights emitted from the oceanic region (a) of the moon, as well as the photon device modules, i.e. a collection of photon device modules (30b), i.e. a collection of the PN bond-type semiconductors' light-emitting device (D5) designed in similar nature to the lunar lights emitted from the highland region (b) of the moon, and each of the photon device modules (30a) (30b) contains the operational sensor (30s).

The PN bond-type semiconductors' light-emitting device (D4) has a designed scope of the wavelengths of approximately 300λ-700λ, and practically useful wavelengths were 430λ-670λ.

As well, the scope of luminous intensity of the PN bond-type semiconductors' light-emitting device (D5) was approximately 220 lx-770 lx, and practically useful brightness was in the scope of 380-450 lx.

The microcomputer (30C), which is the means to control the radiant artificial lunar light system (30), is provided with a wavelength/luminous intensity designation panel (30f).

The wavelength/luminous intensity panel (30f) is provided with a scale of 300-750 nm for the scope of control and a scale of 200-650 lx for the scope of control for the luminous intensity.

If the radiant artificial lunar light system (30) is supplied with electricity, i.e. powered and operation is instructed by the microcomputer (30C), which is the means to control it, lights are emitted by the radiant artificial lunar light system (30).

Wavelengths (λ=nm) are designated by the Designation Panel (300 according to the spectra of the moon lights emitted from the oceanic region of the moon, and luminous intensity (lx) is designated according to the moon lights emitted from the highland region of the moon, and the PN bond-type semiconductors' photon device modules (30b) of the light-emitting device (D4) emit the artificial lunar lights of the designated brightness. And the photon device modules (30b), with designed luminous intensity, of the photon device (D5) of the PN bond-type semiconductors emit lights of the designated brightness. The two sets of lunar lights are synthesized to emit artificial lunar lights of similar nature to the moon lights emitted from the oceanic and highland regions of the moon.

Undoubtedly, the wavelengths and luminous intensity of the artificial lunar lights are automatically controlled according to the instruction inputted in the program of the microcomputer (30C).

If the luminous intensity of the artificial lunar lights emitted to the plants is as low as 200 lx or lower, the plants show little reaction, and if it is over 700 lx, the plants showed fatigue.

The artificial lunar lights are heatless and luminescent, and if the artificial lunar lights are emitted to the plants by the radiant artificial lunar light system (30), plants can grow more effectively.

REFERENCE NUMBERS 10, 20, 30: artificial lunar light-emitting system
10A: photon energy core
10B: luminous intensity core
10a, 10b, 20a: photon device module
10C, 20C, 30C: microcomputer
10f: operation display panel
10s, 30s: operation observing sensor
20f: button panel
20w: operation display window
30f: wavelength/luminous intensity designation panel
D1, D2, D3, D4, D5: PN bond-type semiconductor's light-emitting device

What is claimed is:

1. A radiant artificial lunar light system comprising:
    a photon energy core which includes high photon energy PN bond-type semiconductor photon device modules, each doped with mineral elements for plant growth; and
    a luminous intensity core which includes a plurality of PN bond-type semiconductors' luminous intensity-centered photon device modules that are controlled by a microcomputer,
    wherein the microcomputer is configured to control luminous intensity of artificial lunar lights emitted to the plants.

2. The radiant artificial lunar light system as claimed in claim 1,
    wherein the artificial lunar light system is characteristic in that it has the photon energy core consisting of the PN bond-type semiconductors' light-emitting device modules and the luminous intensity core consisting of the PN bond-type light-emitting device modules that emit lights of certain radiance so that it contains effective elements for the growth of plants.

3. The radiant artificial lunar light system as claimed in claim 1, wherein the radiant artificial lunar light system is characteristic in that it contains photon device modules of a plural PN bond-type semiconductors' light-emitting device doped with donors of mineral elements contained therein for the plants to grow effectively.

4. The radiant artificial lunar light system as claimed in claim 1, wherein the radiant artificial lunar light system contains photon device modules of the PN bond-type semiconductors' light-emitting device with designed wavelengths, and the photon device modules with designed radiance that emits lights, for effective growth of plants.

5. The radiant artificial lunar light system as claimed in claim 1, wherein mineral elements doping the PN bond-type semiconductors' light-emitting device are each one of the Si, Ti, Al, Fe, Mg, Ca, Na, K, P, Mn, Cr, having the effective elements for the growth of plants.

6. The radiant artificial lunar light system as claimed in claim 1, wherein the radiant lunar light system composing the PN bond-type semiconductors' light-emitting device is each doped for the effective growth of plants.

7. The radiant artificial lunar light system as claimed in claim 1, wherein the radiant artificial lunar light system contains the microcomputer equipped with a program to control the radiant artificial lunar light system for effective growth of plants.

8. The radiant artificial lunar light system as claimed in claim 1, wherein the artificial lunar lights emitted from the radiant artificial lunar light system are luminescent and contain mineral elements for effective growth of plants.

* * * * *